(12) United States Patent
Lai

(10) Patent No.: US 6,570,775 B2
(45) Date of Patent: May 27, 2003

(54) CIRCUIT BOARD ASSEMBLY HAVING A COMPACT STRUCTURE

(75) Inventor: Chia Ching Lai, Chong Ho (TW)

(73) Assignee: Global Sun Technology Inc., Taipei (TW)

( * ) Notice: Subject to any disclaimer, the term of this patent is extended or adjusted under 35 U.S.C. 154(b) by 0 days.

(21) Appl. No.: 09/960,150

(22) Filed: Sep. 20, 2001

(65) Prior Publication Data

US 2003/0053303 A1 Mar. 20, 2003

(51) Int. Cl.[7] ............................. H05K 7/00; H05K 7/16
(52) U.S. Cl. ..................... 361/801; 361/740; 361/784; 361/790; 361/807; 439/74
(58) Field of Search ....................... 361/728, 729, 361/752, 753, 784, 785, 790, 803, 807, 801, 802, 737, 740; 211/41.17; 439/55, 62, 74; 174/51

(56) References Cited

U.S. PATENT DOCUMENTS

| | | | | |
|---|---|---|---|---|
| 3,701,017 A | * | 10/1972 | Laane ........................ 375/252 |
| 4,602,351 A | * | 7/1986 | Shimamura et al. .......... 365/52 |
| 4,678,252 A | * | 7/1987 | Moore .......................... 439/62 |
| 4,840,570 A | * | 6/1989 | Mann et al. ................... 439/74 |
| 4,979,075 A | * | 12/1990 | Murphy ....................... 361/686 |
| 4,986,778 A | * | 1/1991 | Liken et al. ................... 439/74 |
| 5,099,394 A | * | 3/1992 | Hood et al. .................. 361/785 |
| 5,268,820 A | * | 12/1993 | Tseng et al. ................. 361/785 |
| 5,603,629 A | * | 2/1997 | DeFrasne et al. ........... 439/331 |
| 5,611,057 A | * | 3/1997 | Pecone et al. .............. 710/301 |
| 5,973,918 A | * | 10/1999 | Felcman et al. ............. 361/683 |
| 6,106,317 A | * | 8/2000 | Michaelis et al. .......... 439/326 |
| 6,256,208 B1 | * | 7/2001 | Supinski et al. ............ 361/784 |

* cited by examiner

Primary Examiner—Jayprakash N. Gandhi

(57) ABSTRACT

A circuit board device includes a secondary circuit board supported on a primary circuit board and parallel to the primary circuit board for forming a compact structure. The secondary circuit board includes one end coupler for coupling to another coupler of the primary circuit board, and the other end having one or more rods supported on a frame for allowing the secondary circuit board to be stably supported on the primary circuit board. A housing may prevent the secondary circuit board from being interfered by the electromagnetic field of the primary circuit board.

17 Claims, 3 Drawing Sheets

CIRCUIT BOARD ASSEMBLY HAVING A COMPACT STRUCTURE

BACKGROUND OF THE INVENTION

1. Field of the Invention

The present invention relates to a circuit board assembly, and more particularly to a circuit board assembly having a compact structure.

2. Description of the Prior Art

Typical circuit board assemblies comprise a primary circuit board, and one or more circuit units or circuit modules or interface cards to be superposed and supported on the primary circuit board. Normally, the circuit units or the circuit modules or the interface cards are made into various kinds of shapes or standards or widths or lengths that may not be superposed and supported on the primary circuit board in a compact structure, such that the circuit units or the circuit modules or the interface cards may occupy a large area or volume of the primary circuit board.

The present invention has arisen to mitigate and/or obviate the afore-described disadvantages of the conventional circuit board assemblies.

SUMMARY OF THE INVENTION

The primary objective of the present invention is to provide a circuit board assembly including one or more circuit units or circuit modules or interface cards superposed and supported on a primary circuit board for forming a compact structure.

In accordance with one aspect of the invention, there is provided a circuit board assembly comprising a primary circuit board, a secondary circuit board, and means for supporting the secondary circuit board on the primary circuit board, and parallel to the primary circuit board, in a compact configuration.

The secondary circuit board includes a first end having a first coupler provided thereon, the supporting means includes a second coupler attached on the primary circuit board and coupled to the first coupler for supporting the secondary circuit board on the primary circuit board.

The primary circuit board includes a plurality of orifices formed therein, the second coupler includes a plurality pins engaged into the orifices of the primary circuit board, and the pins each includes an extension engaged into the first coupler of the secondary circuit board.

The second coupler includes a bar, the pins are secured on the bar. The extensions of the pins are preferably perpendicular to the pins respectively and parallel to the primary circuit board.

A housing is further provided for receiving the secondary circuit board and for forming a circuit unit. The housing is preferably a metal housing for shielding the secondary circuit board and for separating the secondary circuit board from the primary circuit board, and for preventing the secondary circuit board from being interfered or affected by the electromagnetic field or force generated by the electric parts or elements of the primary circuit board.

The supporting means includes a frame secured on the primary circuit board and engaged with the housing for supporting the secondary circuit board and the housing on the primary circuit board.

The frame includes at least one panel having an opening formed therein, the housing includes at least one rod engaged in the opening of the panel for supporting the secondary circuit board and the housing on the primary circuit board. The opening of the panel is preferably facing away from the housing.

The frame includes a beam secured to the panel and secured to the primary circuit board for supporting the panel and thus the secondary circuit board and the housing on the primary circuit board.

A device is further provided for grounding the housing and includes a conductive member engaged between the housing and the primary circuit board for grounding the housing. The conductive member includes a foamable material and a conductive material engaged in the foamable material.

Further objectives and advantages of the present invention will become apparent from a careful reading of a detailed description provided hereinbelow, with appropriate reference to accompanying drawings.

DETAILED DESCRIPTION OF THE PREFERRED EMBODIMENT

Figure 1:
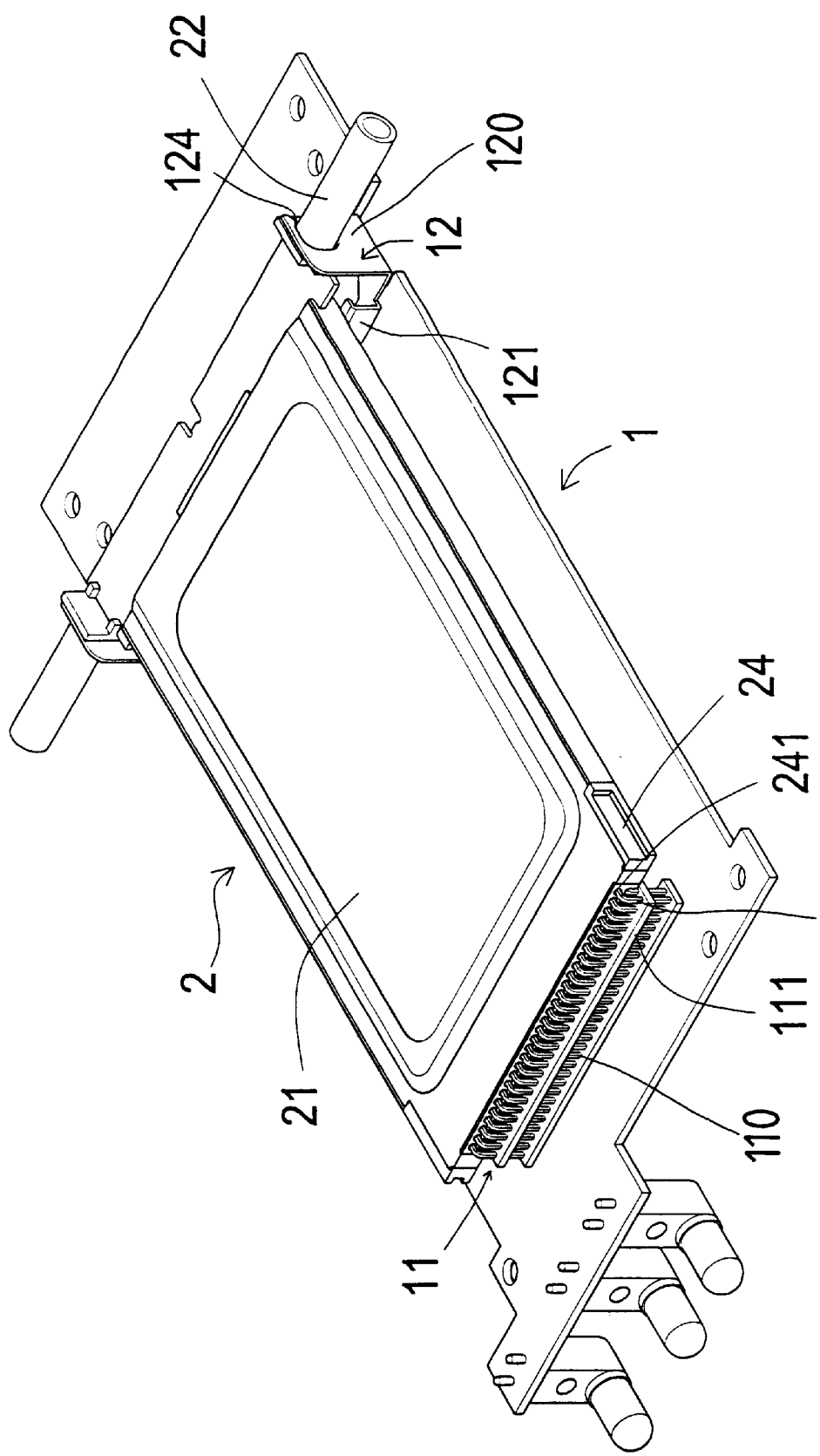
FIG. 1 is a perspective view of a circuit board assembly in accordance with the present invention.
Figure 2:
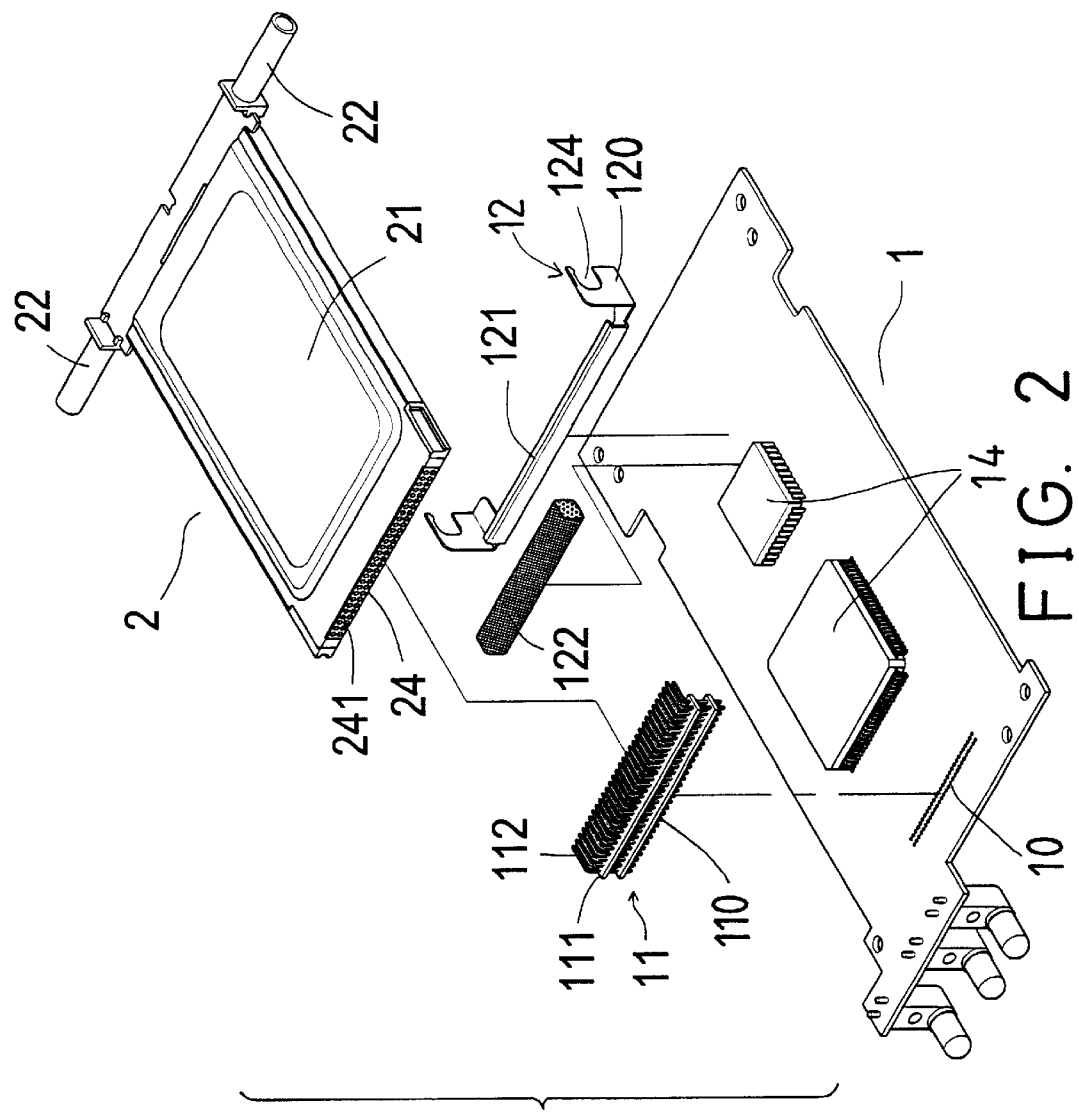
FIG. 2 is an exploded view of the circuit board assembly.

Referring to the drawings, a circuit board assembly in accordance with the present invention comprises a primary circuit board 1 including one or more rows of orifices 10 formed therein, and including one or more electric parts or elements 14, such as the chips or the integrated circuits or the processor units 14 secured or plugged thereon. A coupler 11 includes a number of pins 110, such as one or more rows of pins 110 secured together with a bar 111 or the like, for engaging or plugging into the orifices 10 of the primary circuit board 1, and/or for electrically coupling to the primary circuit board 1. The pins 110 each includes a bent portion or an extension 112 extended therefrom and perpendicular to the pins 110 respectively and/or parallel to the primary circuit board 1, for example.

A support or a frame 12 is disposed or secured on the primary circuit board 1 with such as the fasteners, the adhesive materials, or by welding processes, and includes a beam 121, and two panels 120 provided and secured on the ends of the beam 121. The panels 120 each includes a notch or an opening 124 formed therein and facing away from the orifices 10 of the primary circuit board 1 or facing away from the coupler 11.

Figure 3:
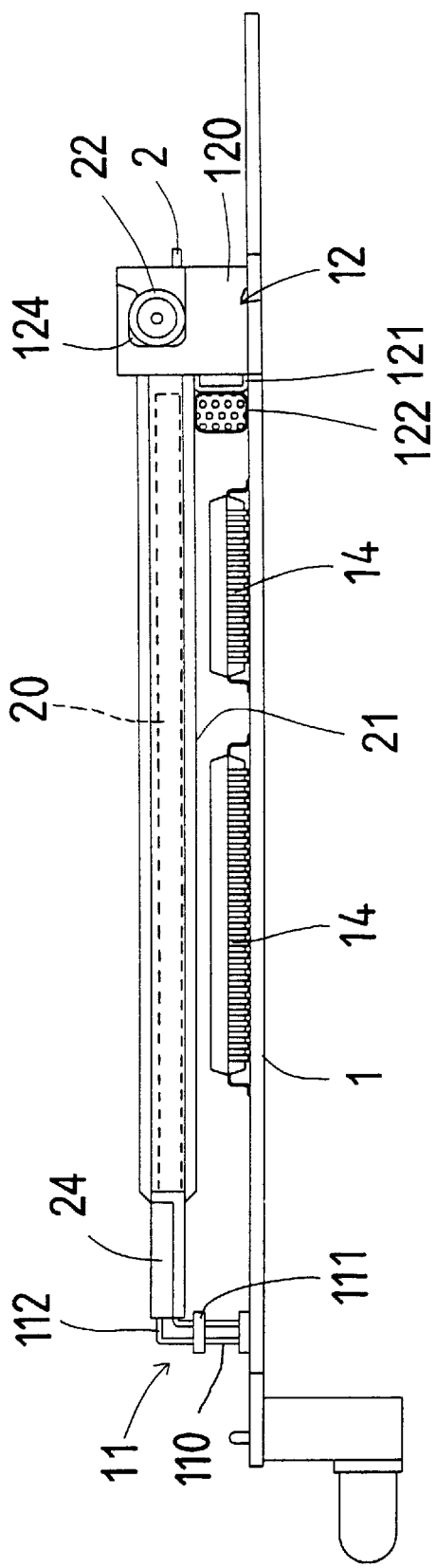
FIG. 3 is a plan view of the circuit board assembly.

An interface card or a circuit module or a circuit unit 2 includes one end having a rod 22 secured thereto. The rod 22 includes two ends engaged in the openings 124 of the panels 120 for attaching and supporting on the panels 120. Alternatively, the circuit unit 2 may include two rods 22 extended laterally from one end thereof for engaging in the openings 124 of the panels 120 and for attaching and supporting on the panels 120. The circuit unit 2 includes a socket or a coupler 24 provided on the other end thereof and having a number of holes 241 formed therein for receiving or engaging the lateral extensions 112 of the coupler 11 therein and for electrically coupled to the primary circuit board 1 with the coupler 11, and for allowing the circuit unit 2 to be stably supported and superposed on the primary circuit board 1, best shown in FIG. 3. The openings 124 of the panels 120 of the frame 12 are preferably facing away from housing 21 or the secondary circuit board 20.

The circuit unit 2 includes a housing 21, and a secondary circuit board 20 received or secured in the housing 21 and electrically coupled to the socket or coupler 24. The housing 21 is preferably a metal housing 21 for shielding the secondary circuit board 20 and for separating the secondary circuit board 20 from the primary circuit board 1, and for preventing the secondary circuit board 20 from being interfered or affected by the electromagnetic field or force generated by the electric parts or elements of the primary circuit board 1. A resilient or spongy or foamable member 122 is disposed between the housing 21 of the circuit unit 2 and the primary circuit board 1, and includes a metal or conductive material engaged therein for electrically coupling the housing 21 to the primary circuit board 1 and for grounding the housing 21.

The secondary circuit board 20 thus may be superposed and supported and disposed on the primary circuit board 1, in a compact configuration, and may be shielded or protected by the housing 21 such that the secondary circuit board 20 may be prevented from being interfered or affected by the electromagnetic field or force generated by the electric parts or elements of the primary circuit board 1. The resilient or the spongy or the foamable or the conductive member 122 that is disposed between the housing 21 of the circuit unit 2 and the primary circuit board 1 may be used for electrically coupling the housing 21 to the primary circuit board 1 and for grounding the housing 21.

Accordingly, the circuit board assembly in accordance with the present invention includes one or more circuit units or circuit modules or interface cards superposed and supported on a primary circuit board for forming a compact structure.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A circuit board assembly comprising:
   a primary circuit board,
   a secondary circuit board including a first end having a first coupler provided thereon, and
   means for supporting said secondary circuit board on said primary circuit board, and parallel to said primary circuit board, in a compact configuration, said supporting means including a second coupler attached on said primary circuit board and coupled to said first coupler for supporting said secondary circuit board on said primary circuit board.

2. The circuit board assembly according to claim 1, wherein said primary circuit board includes a plurality of orifices formed therein, said second coupler includes a plurality pins engaged into said orifices of said primary circuit board, and said pins each includes an extension engaged into said first coupler of said secondary circuit board.

3. The circuit board assembly according to claim 2, wherein said second coupler includes a bar, said pins are secured on said bar.

4. The circuit board assembly according to claim 2, wherein said extensions of said pins are perpendicular to said pins respectively and parallel to said primary circuit board.

5. The circuit board assembly according to claim 1 further comprising a housing, said secondary circuit board being received in said housing for forming a circuit unit.

6. The circuit board assembly according to claim 1, wherein said supporting means includes a frame secured on said primary circuit board for engaging with said secondary circuit board and for supporting said secondary circuit board on said primary circuit board.

7. A circuit board assembly comprising:
   a housing,
   a primary circuit board,
   a secondary circuit board received in said housing for forming a circuit unit, and
   means for supporting said secondary circuit board on said primary circuit board, and parallel to said primary circuit board, in a compact configuration, said supporting means including a frame secured on said primary circuit board and engaged with said housing for supporting said secondary circuit board and said housing on said primary circuit board.

8. The circuit board assembly according to claim 7, wherein said frame includes at least one panel having an opening formed therein, said housing includes at least one rod engaged in said opening of said at least one panel for supporting said secondary circuit board and said housing on said primary circuit board.

9. The circuit board assembly according to claim 8, wherein said opening of said at least one panel is facing away from said housing.

10. The circuit board assembly according to claim 8, wherein said frame includes a beam secured to said at least one panel and secured to said primary circuit board for supporting said at least one panel and thus said secondary circuit board and said housing on said primary circuit board.

11. A circuit board assembly comprising:
    a housing,
    a primary circuit board,
    a secondary circuit board received in said housing for forming a circuit unit,
    means for supporting said secondary circuit board on said primary circuit board, and parallel to said primary circuit board, in a compact configuration, and
    means for grounding said housing.

12. The circuit board assembly according to claim 11, wherein grounding means includes a conductive member engaged between said housing and said primary circuit board for grounding said housing.

13. The circuit board assembly according to claim 12, wherein said conductive member includes a foamable material and a conductive material engaged in said foamable material.

14. A circuit board assembly comprising:
    a primary circuit board,
    a circuit unit including a first end having a first coupler provided thereon, and
    means for supporting said circuit unit on said primary circuit board, and parallel to said primary circuit board, in a compact configuration, said supporting means including a second coupler attached on said primary circuit board and coupled to said first coupler for supporting said circuit unit on said primary circuit board.

15. The circuit board assembly according to claim 14, wherein said primary circuit board includes a plurality of orifices formed therein, said second coupler includes a bar, a plurality pins secured on said bar and engaged into said orifices of said primary circuit board, and said pins each includes an extension engaged into said first coupler of said secondary circuit board, said extensions of said pins are perpendicular to said pins respectively and parallel to said primary circuit board.

16. The circuit board assembly according to claim 14, wherein circuit unit includes a housing, and a secondary circuit board received in said housing.

17. A circuit board assembly comprising:

a housing, a primary circuit board, a secondary circuit board received in said housing, a circuit unit, and means for supporting said circuit unit on said primary circuit board, and parallel to said primary circuit board, in a compact configuration, and said supporting means including a frame secured on said primary circuit board and engaged with said housing for supporting said secondary circuit board and said housing on said primary circuit board, said frame including at least one panel having an opening formed therein, said housing including at least one rod engaged in said opening of said at least one panel for supporting said secondary circuit board and said housing on said primary circuit board.

* * * * *